(12) United States Patent
Devine

(10) Patent No.: US 8,415,955 B2
(45) Date of Patent: Apr. 9, 2013

(54) ELECTRICAL TEST DEVICE

(75) Inventor: Christopher James Devine, Newmarket (AU)

(73) Assignee: Industrial Control & Electrical Pty Ltd, Queensland (AU)

( * ) Notice: Subject to any disclaimer, the term of this patent is extended or adjusted under 35 U.S.C. 154(b) by 786 days.

(21) Appl. No.: 12/536,530

(22) Filed: Aug. 6, 2009

(65) Prior Publication Data

US 2010/0033190 A1   Feb. 11, 2010

(30) Foreign Application Priority Data

Aug. 8, 2008  (AU) ................................ 2008904064

(51) Int. Cl.
*G01R 31/00* (2006.01)

(52) U.S. Cl.
USPC ............................ 324/500; 324/522; 324/525

(58) Field of Classification Search ........................ None
See application file for complete search history.

(56) References Cited

U.S. PATENT DOCUMENTS

| 3,376,551 | A | * | 4/1968 | Armbruster | .................... 382/188 |
| 4,804,908 | A | | 2/1989 | Mitchell | |
| 5,710,513 | A | * | 1/1998 | March | ........................... 324/424 |
| 6,020,822 | A | | 2/2000 | Marshall | |
| 6,100,679 | A | | 8/2000 | McCasland | |
| 6,323,638 | B2 | | 11/2001 | McNulty | |
| 6,424,263 | B1 | * | 7/2002 | Lee et al. | .................... 340/572.7 |
| 6,531,880 | B1 | | 3/2003 | Schneider et al. | |
| 7,295,130 | B2 | | 11/2007 | Luebke et al. | |
| 7,319,315 | B2 | | 1/2008 | Martin | |
| 7,679,391 | B2 | * | 3/2010 | Watanabe et al. | .......... 324/750.3 |

* cited by examiner

*Primary Examiner* — Jermele M Hollington
*Assistant Examiner* — Trung Nguyen
(74) *Attorney, Agent, or Firm* — Harness, Dickey & Pierce, P.L.C.

(57) ABSTRACT

An electrical test device including at least one transducer to detect a status of a circuit under test, and at least one indicator located remotely from the at least one transducer to display the status of the circuit under test.

18 Claims, 3 Drawing Sheets

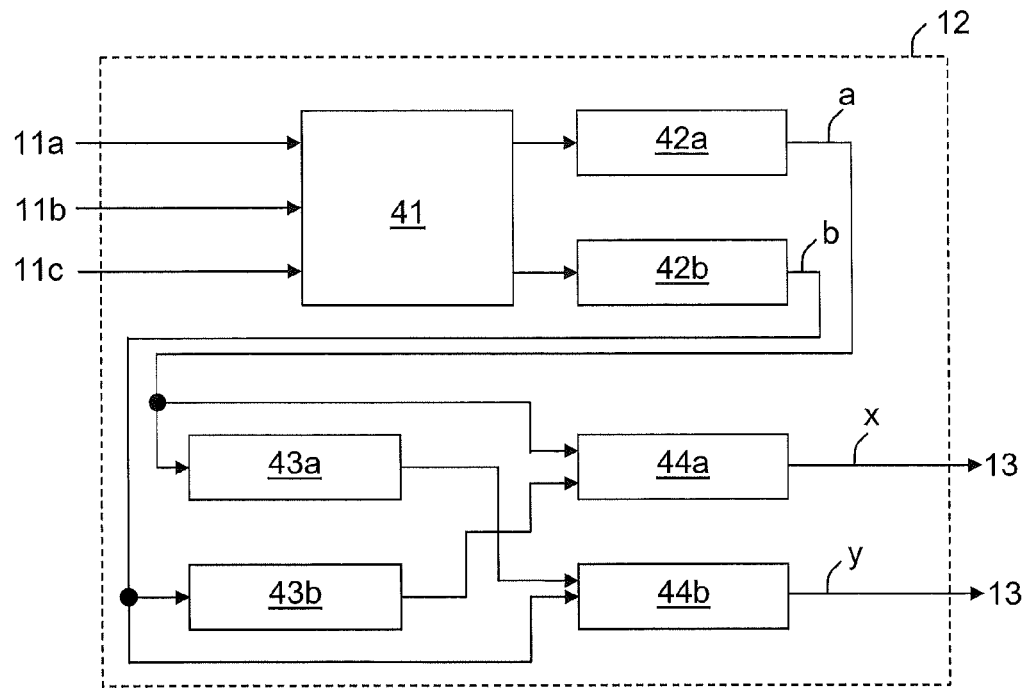
Fig 4
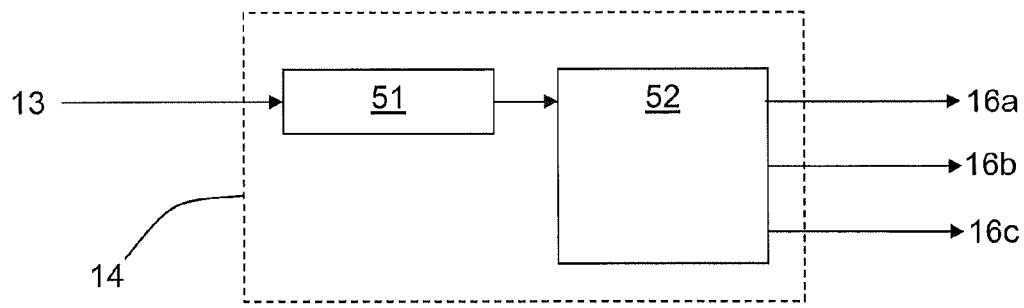
Fig 5
| Isolation Confirmation Procedure | | | |
|---|---|---|---|
| Operator Actions | | DeadEasy Results | |
| Isolator | Self Test | Green LED | Red LED |
| 1 | 0 | Off | ON |
| 0 | 0 | ON | Off |
| 0 | 1 | Off | ON |
| Danger Isolation Confirmation Procedure must generate nominated LED lamp indication. Any deviations observed must be investigated. | | | |
← 61
← 62
← 63
Fig 6

ELECTRICAL TEST DEVICE

CROSS-REFERENCE TO RELATED APPLICATIONS

This application claims the benefit and priority of Australian Provisional Patent Application No. 2008904064, filed Aug. 8, 2008. The entire disclosure of the above application is incorporated herein by reference.

FIELD

This invention relates to the testing of an electrical circuit and more particularly to a device that tests whether the electrical circuit is de-energized.

BACKGROUND

This section provides background information related to the present disclosure which is not necessarily prior art.

When performing installation or maintenance work on electrically powered equipment, it is necessary to determine the status of an electrical circuit supplying the equipment to ensure it is switched off. Hardware commonly used for isolating plant and machinery may include circuit breakers, isolators, switches, links and fuses. Hardware that has been incorrectly isolated or is faulty can result in electric shock and injury to an operator or damage to the equipment.

Electrical equipment may be incorrectly isolated due to a number of different reasons including faulty contact mechanisms, faulty handles and misaligned handle mechanisms. One method of determining whether the equipment is de-energized is to measure a voltage on the exposed conductors of an electrical circuit supplying the equipment using a voltmeter. This process is widely known as "proving dead" or "testing for dead" and incorporates a three step procedure.

Firstly, an operator needs to ascertain whether the voltmeter is operating correctly by connecting the test leads of the voltmeter to a known energized circuit and verifying that the measured voltage is within defined limits. Secondly, the operator connects the voltmeter to the electrical circuit under test to check the absence of a voltage. Finally, the operator verifies that the voltmeter is working by re-measuring the voltage of the known energized circuit and ensuring that the measured value falls within the limits. This procedure allows the operator to conclude that the voltmeter was operating correctly during the testing of the circuit under test step and that the circuit has been proven de-energized.

U.S. Pat. Nos. 4,804,908, 6,100,679, 6,323,638 describe devices that require a direct connection with the electrical conductors of the circuit under test. A drawback of these devices is that the operator is exposed to hazardous voltages and therefore the test may only be performed by trained and licensed personnel.

U.S. Pat. Nos. 6,531,880, 7,295,130 disclose devices that do not require a direct connection with the electrical conductors of the circuit under test. These devices allow the operator to perform the test by placing the device in the near vicinity of the insulated conductor and measuring the electric and/or magnetic field. A disadvantage of these devices is that they must be placed within a short distance of the circuit under test which may not be possible or at least safe, for circuits enclosed within an equipment cabinet. Furthermore conductive enclosures and barriers attenuate electric and or magnetic fields making the measurements unreliable. In order to perform the test the operator may need to access inside the cabinet, again, requiring the services of trained and licensed personnel.

Other testing devices commonly used are permanently connected to the circuit under test and may take the form of voltmeters or indicating lamps. These devices may incorporate a self testing function in the form of a push button that applies a known test voltage. The operator utilises these permanently connected devices together with the "testing for dead" procedure to prove that the circuit has been de-energized. U.S. Pat. No. 5,986,557 describes a fuse status indicator incorporating pseudo-self testing. A disadvantage of this system however is its complexity. The use of permanently connected testing devices on a high energy power circuit may compromise the ability of the robust power circuit to withstand power system disturbances and their subsequent mechanical forces. Such testing devices may weaken the robustness of the circuit under test. Furthermore such a system is expensive to install.

U.S. Pat. Nos. 6,020,822 and 7,319,315 describe devices that may be used by untrained personnel where the device is plugged into a standard electrical outlet or General Purpose Outlet (GPO). A limiting factor of these devices is that they are unsuitable for checking circuits other than those fitted with a GPO. A further drawback of these devices is that live electrical terminals that potentially convey high energy are accessible to an operator. As such inadvertent contact with the terminals, or damage of the device while in use, may potentially expose the operator to electric burns or electric shock.

A device in the form of a passive test point is also commonly available that conveys the presence of an electric field surrounding an internal circuit to the outside of an electrical enclosure. An operator may then with the assistance of a portable electric field measuring device detect the presence or absence of an internal electric field and hence the presence or absence of voltage on the circuit under test. A drawback of these devices are that in the case of circuits incorporating more than one phase the operator must measure all phases, determine what constitutes an energized or de-energized phase and conclude through processing the results whether the circuit under test is energized or de-energized. A further drawback is that the passive devices do not offer the provision for self testing for the condition when the test point is short circuited to earth and the circuit under test has been isolated.

SUMMARY

This section provides a general summary of the disclosure, and is not a comprehensive disclosure of its full scope or all of its features.

The specification describes an electrical test device to determine a status of a circuit under test. The electrical test device includes a transducer to detect the status of the circuit under test, and an indicator located remotely from the transducer to display the status of the circuit under test. Normally, the transducer determines whether at least one conductor of the circuit under test is energized. Preferably, the transducer is an electrical lead coiled around a conductor of the circuit under test. Preferably, the electrical lead is insulated. The electrical lead may be screened and a section at a free end of the electrical lead is left unscreened. Alternatively, the transducer is an electrical lead placed substantially parallel to at least one conductor of the circuit under test. Preferably, the at least one indicator is an LED.

Preferably, the electrical test device incorporates a self test circuit activated by an operator, to determine whether the electrical test device is reporting accurate results and whether the transducer is mechanically attached to the circuit under test. Additionally, the self test circuit includes a voltage generator that injects a voltage into the circuit under test. Preferably, an operating frequency of the voltage generator is higher than an operating frequency of the circuit under test.

Preferably, the electrical test device includes at least one detector circuit to convert an analog signal from the transducer to a digital signal.

Preferably, the electrical test device further includes a logic processing circuit connected between the detector circuit and the at least one indicator. Suitably, the logic processing circuit includes a fault detection circuit that minimizes the possibility of the electrical test device reporting an incorrect result.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 4 is a block diagram of a logic processing circuit of the electrical test device in FIG. 1;

FIG. 5 is a block diagram of a self test circuit of the electrical test device in FIG. 1; and FIG. 6 is a table showing the verification procedure of the electrical test device.

Corresponding reference numerals indicate corresponding parts throughout the several views of the drawings.

DETAILED DESCRIPTION

Example embodiments will now be described more fully with reference to the accompanying drawings. In this specification, adjectives such as first and second, left and right, and the like may be used solely to distinguish one element or action from another element or action without necessarily requiring or implying any actual such relationship or order. Words such as "comprises" or "includes" are intended to define a non-exclusive inclusion, such that a process, method, article, or apparatus that comprises a list of elements does not include only those elements but may include other elements not expressly listed, including elements that are inherent to such a process, method, article, or apparatus.

Figure 1:
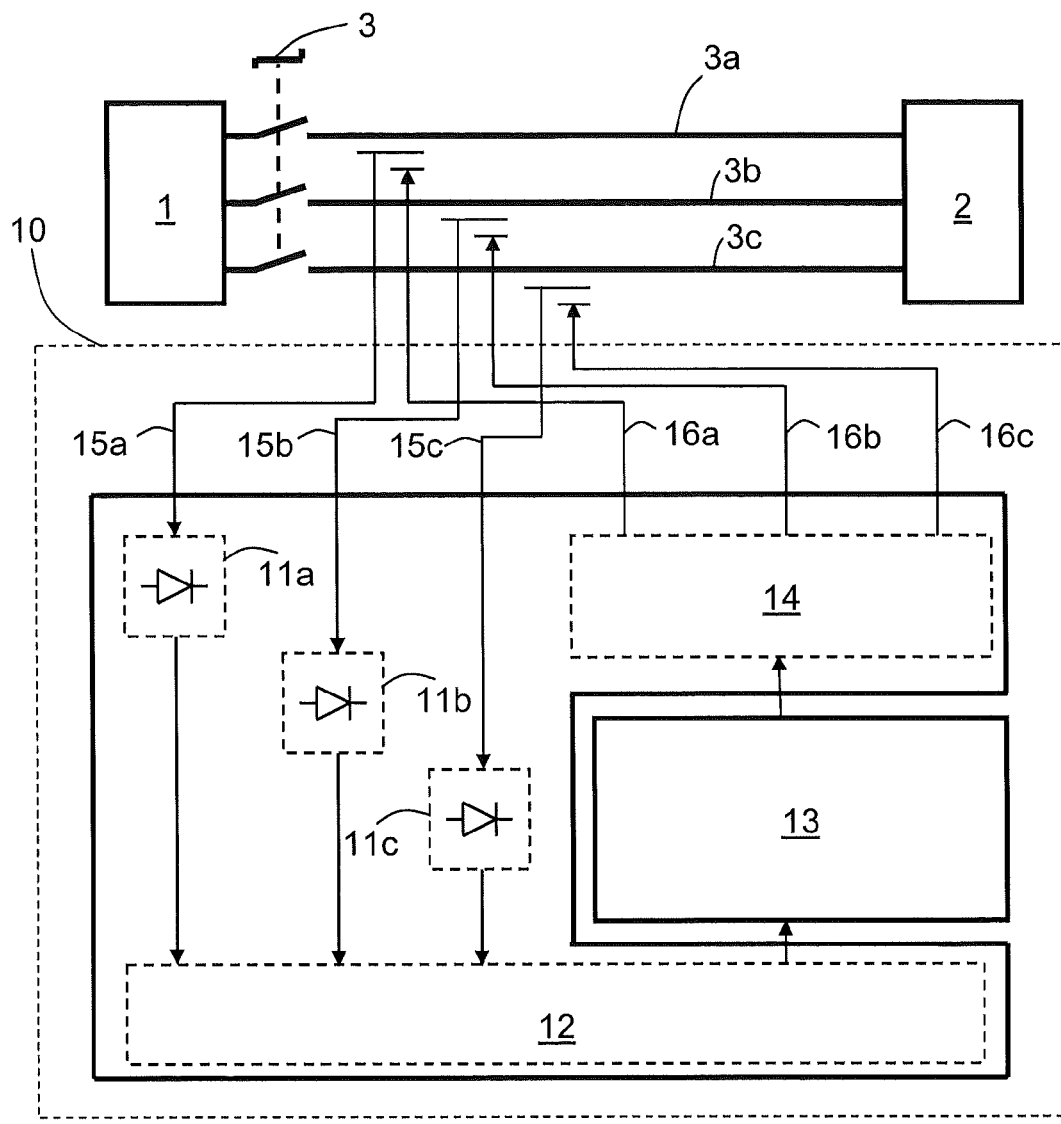
FIG. 1 is a block diagram of the electrical test device in accordance with an embodiment of the present invention.

FIG. 1 is a block diagram of an electrical test device 10 according to an embodiment of the present invention. In this embodiment the electrical test device 10 is designed to test an electrical circuit such as a three phase power supply in the form of a circuit under test 3a, 3b, 3c however it should be appreciated that the present invention may be designed to be used with a single phase supply or any other applicable supply. Conductors of the circuit under test 3a, 3b, 3c may connect a power source 1 and a load 2 via an isolator 3 in the form of a switch, fuse, circuit breaker or any other suitable isolator 3.

The electrical test device 10 includes transducers in the form of sensor leads 15a, 15b, 15c and test leads 16a, 16b, 16c.

Figure 2:
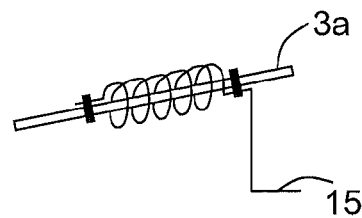
FIG. 2 is a detailed view of an insulated sensor lead coiled around an insulated conductor of a circuit under test.

Sensor leads 15a, 15b, 15c are made from any suitable electrical lead which is preferably screened and insulated. When a screened electrical lead is used a section at a free end of the electrical lead is left unscreened. The remaining section of the electrical lead remains screened. A shield and a lead at the screened end of the sensor lead 15a, 15b, 15c may connect to the electrical test device 10 by means of a terminal block, plug and socket arrangement or directly to a printed circuit board. The unscreened section of the free end is wrapped around the circuit under test 3a, 3b or 3c in a coil. FIG. 2 shows sensor lead 15a coiled around a conductor of circuit under test 3a. Similarly, sensor lead 15b is coiled around conductor of circuit under test 3b and sensor lead 15c is coiled around conductor of circuit under test 3c. Each side of the coil is secured using a tie wrap or any other applicable method such as insulating tape. Although the sensor lead 15a, 15b, or 15c is coiled around the circuit under test 3a, 3b or 3c, it is not in electrical contact with it. Alternatively, the sensor leads 15a, 15b or 15c may be placed parallel with the circuit under test 3a, 3b, 3c however coiling the sensor leads 15a, 15b or 15c around the circuit under test 3a, 3b, 3c will produce the greatest signal level from the circuit under test whilst at the same time minimizing the signal level from adjacent circuits. Furthermore the coiled sensor leads 15a, 15b, 15c may be placed in close proximity to the circuit under test 3a, 3b, 3c.

It should also be noted that any other suitable transducers may be used to detect the field emanating from an energized conductor such as solid state detectors or Hall Effect transducers and placed in close proximity or around the conductors of the circuit under test 3a, 3b, 3c.

Figure 3:
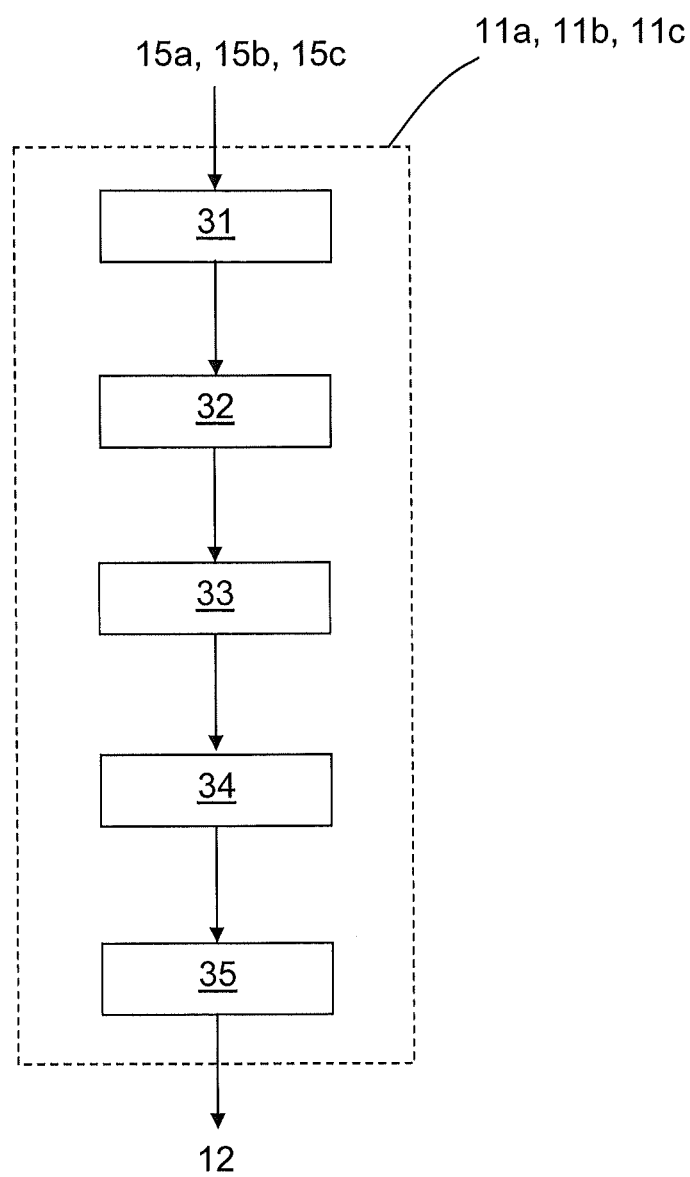
FIG. 3 is a block diagram of a detector circuit of the electrical test device in FIG. 1.

Each sensor lead 15a, 15b, 15c connects to detector circuits 11a, 11b, 11c. FIG. 3 is a block diagram of the detector circuits 11a, 11b, 11c of the electrical test device in FIG. 1. Each sensor lead 15a, 15b, 15c connects to a respective rectifier 31 that, in the case of an alternating current (ac) signal, half-rectifies the signal from sensor leads 15a, 15b, 15c into a pulsed, positive going signal only. The negative part of the signal is similar in shape to the positive going signal and is therefore discarded thereby creating the half-wave rectified signal. The output from the rectifier 31 is connected to a limiter 32 that limits the amplitude of the half-rectified signal to protect circuit components before being fed into a first comparator 33. The first comparator 33 compares the rectified signal with a first reference voltage. If the rectified signal is above the first reference voltage, the comparator outputs a pulsed, square wave to the peak hold circuitry 34. The peak hold circuitry 34 incorporates a time delay function that smooths the pulsed square wave to create a DC signal. The time delay is tuned to provide this smoothing function for pulsing frequencies as low as 50 Hz but so as not to impede the responsive performance of the detector circuit in the event of loss of the sensed signal. A second comparator 35 converts the previous analogue signal to a digital signal to indicate that the conductor is either energized or de-energized. Essentially the second comparator 35 compares the smoothed, sensed signal with a second reference voltage. If the smoothed, sensed signal is above the second reference voltage the comparator outputs a logical high signal to the logic processing circuit 12.

FIG. 4 is a block diagram of a logic processing circuit 12 of the electrical test device 10. The output signals from each of the detectors 11a, 11b, 11c are connected to the logic processing circuitry 12 and mathematically added together in summing unit 41.

A first output from the summing unit 41 is connected to the input of a first comparator 42a. If the first output from the summing unit 41 is greater than a first reference voltage of the first comparator 42a, then output a from first comparator 42a is a logical high. This indicates that the circuit under test 3a, 3b, 3c is energized.

A second output from the summing unit 41 is connected to the input of a second comparator 42b. If the second output from the summing unit 41 is less than a second reference voltage of the second comparator 42b, the output from second comparator 42b is a logical high. This indicates that the circuit under test 3a, 3b, 3c is de-energized.

The first reference voltage should be greater than the second reference voltage.

The outputs a and b from first and second comparators 42a and 42b respectively are connected to a series of logical gates consisting of logical inverters 43a and 43b and logical AND gates 44a and 44b. The outputs from AND gates 44a and 44b are x and y respectively. The truth table relating logic gates 43a, 43b, 44a and 44b is shown in the table below:

| Input | | Output | |
|---|---|---|---|
| a | b | x | y |
| 0 | 0 | 0 | 0 |
| 0 | 1 | 0 | 1 |
| 1 | 0 | 1 | 0 |
| 1 | 1 | 0 | 0 |

Theoretically, inputs a and b cannot both be a logic 0 or 1 and this would indicate a power supply or test device fault.

It will be appreciated that other methods may be employed that perform the same function as the logic processing circuitry 12. For example a micro-controller or microprocessor may be used to the same effect, where the signal processing takes place in software rather than using individual logic gates and components. In addition other methods that provide circuit redundancy, fault detection or circuit voting schemes may be employed to enhance the reliability of the result reported by the logic processing unit. For example the logic processing circuit may include a fault detection circuit that minimizes the possibility of the electrical test device reporting an incorrect result.

The status of the circuit under test 3a, 3b, 3c is displayed on the indicator 13 which displays either a red or a green LED depending on the logic levels on the outputs of logical AND gates 44a and 44b. The indicator may be located with the main circuitry (detectors 11a, 11b, 11c, logic circuitry 12 and self test circuit 14) or the indicator 13 may be remotely located from the main circuitry and connected by a link. It should be noted that the link may be a lead or alternatively the link may be wireless such as a radio or infra-red link. By locating the indicator remotely from the electrical circuit under test a user may determine that the circuit is safe before accessing any hazardous areas.

The green LED is illuminated when the circuit under test is de-energized, that is to say the output from logical AND gate 44b is high and the output from logical AND gate 44a is low. Similarly, the red LED is illuminated when the output from logical AND gate 44a is high and the output from logical AND gate 44b is low, indicating that the circuit under test is energized. The presence of a voltage on all conductors of the circuit under test 3a, 3b, 3c is required to illuminate the red LED. The absence of a voltage on all conductors of the circuit under test is required to illuminate the green LED. Any other combination will result in neither the red LED nor the green LED being illuminated. In this way only when all conductors, of the circuit under test, are de-energized will the green LED be illuminated indicating that the circuit is verified as de-energized.

FIG. 5 shows a block diagram of a self test circuit 14 including a delay circuit 51 and a voltage generator 52 to determine whether the electrical test device is working properly within prescribed limits. Furthermore, the self test circuit 14 determines whether the electrical test device 10 is reporting accurate results and whether the sensor leads 15a, 15b, 15c are mechanically attached to the circuit under test. When a self test button is pressed on the indicator 13 by an operator, the delay circuit 51 activates the generator 52 for a set period of time for example 3 seconds however any other suitable time may be used. The self-test button may be a proximity switch that may be activated from behind a glass panel of an equipment rack however any suitable switch may be used.

The generator 52 outputs an alternating current waveform which is capacitively coupled into the sensor leads 15a, 15b and 15c via injection leads 16a, 16b, 16c. The injection leads 16a, 16b, 16c are wrapped around the sensor leads of the circuit under test. In this way they provide higher sensitivity to this circuit without providing high sensitivity to other adjacent circuits. In addition, they afford a high integrity mechanical attachment which is less likely to be inadvertently separated from the sensing leads and hence the circuit under test. They also afford a screening effect of the sensing leads, from other adjacent circuits.

The alternating current waveform is of lower amplitude but higher frequency to that of the circuit under test 3a, 3b, 3c. The increased frequency however produces a response from the comparators 11a, 11b and 11c of an energized circuit under test 3a, 3b, 3c. The advantage is that the complexity and expense of generating a high voltage test waveform is removed by using components rated at a lower voltage.

A "test for dead" procedure may be performed using the present invention without the need for a secondary testing device. The procedure is shown in the table of FIG. 6. At step 61 the circuit under test is presumed to be switched on (energized state) and the operator verifies that the red LED is displayed on the indicator 13. At step 62, the operator switches off (de-energizes) the circuit under test 3a, 3b, 3c, and verifies that the green LED is illuminated on the indicator 13. At step 63, the operator initiates the self-test routine. A voltage is injected into the sensor leads 15a, 15b, 15c for the predetermined period of time. During this time the red LED will be illuminated and when the generator output ceases, the green LED will again be illuminated. After this simple procedure has been followed, the circuit under test is verified as de-energized.

The advantages of the electrical test device described above include: (1) The operator can verify that the circuit under test 3a, 3b, 3c has been de-energized without accessing any areas housing potentially hazardous voltages; (2) The operator can determine that the de-energized test result as reported by the electrical test device 10 is accurate; (3) It is inexpensive to install and does not compromise the integrity of the circuit under test. The sensor leads do not require to be electrically connected to the conductors of the circuit under test 3a, 3b, 3c; (4) It is easy to use and does not require trained and qualified personnel; (5) The testing procedure is familiar to operators and is recognized in industry for its integrity; and (6) It allows operators to repeat the test subsequent to the initial operator test to verify the de-energized state of the circuit and the correct operation of the test device.

The above description of an embodiment of the present invention is provided for purposes of description to one of ordinary skill in the related art. It is not intended to be exhaustive or to limit the invention to a single disclosed embodiment. As mentioned above, numerous alternatives and variations to the present invention will be apparent to those skilled in the art of the above teaching. Accordingly, while some alternative embodiments have been discussed specifically, other embodiments will be apparent or relatively easily developed by those of ordinary skill in the art. Accordingly, this invention is intended to embrace all alternatives, modifications and variations of the present invention that have been discussed herein, and other embodiments that fall within the spirit and scope of the above described invention. The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. An electrical test device comprising:
    at least one transducer for mechanically, but not electrically, securing to a circuit under test to detect a presence of a voltage on the circuit under test;
    at least one indicator located remotely from the at least one transducer to display a status of the presence of the voltage on the circuit under test; and
    a self test circuit to determine whether the electrical test device is reporting accurate results, wherein the self test circuit includes at least one injection lead for mechanically, but not electrically, securing around the transducer and thereby the circuit under test, and the self test circuit includes a voltage generator connected to the at least one injection lead for injecting a voltage into the transducer.

2. The electrical test device of claim 1 wherein the transducer comprises an electrical lead coiled around at least one conductor of the circuit under test.

3. The electrical test device of claim 2 wherein the electrical lead is insulated.

4. The electrical test device of claim 2 wherein the electrical lead is screened.

5. The electrical test device of claim 4 wherein a section at a free end of the electrical lead is left unscreened.

6. The electrical test device of claim 3 wherein the at least one injection lead comprises an electrical lead coiled around the coiled transducer.

7. The electrical test device of claim 1 wherein the transducer comprises an electrical lead placed substantially parallel to at least one conductor of the circuit under test.

8. The electrical test device of claim 7 wherein the electrical lead is insulated.

9. The electrical test device of claim 7 wherein the electrical lead is screened.

10. The electrical test device of claim 9 wherein a section at a free end of the electrical lead is left unscreened.

11. The electrical test device of claim 1 wherein the at least one indicator comprises an LED.

12. The electrical test device of claim 1 wherein an operating frequency of the voltage generator is higher than an operating frequency of the circuit under test.

13. The electrical test device of claim 1 further comprising at least one detector circuit to convert an analog signal from the transducer to a digital signal.

14. The electrical test device of claim 13 further comprising a logic processing circuit connected between the detector circuit and the at least one indicator.

15. The electrical test device of claim 13 wherein the logic processing circuit further comprises a fault detection circuit that minimizes the possibility of the electrical test device reporting an incorrect result.

16. The electrical test device of claim 1 wherein the at least one injection lead comprises an electrical lead placed substantially parallel to the transducer.

17. The electrical test device of claim 1 wherein the injection lead is insulated.

18. The electrical test device of claim 1 wherein the injection lead is screened, and a section at a free end of the injection lead is left unscreened.

* * * * *

UNITED STATES PATENT AND TRADEMARK OFFICE
CERTIFICATE OF CORRECTION

PATENT NO. : 8,415,955 B2
APPLICATION NO. : 12/536530
DATED : April 9, 2013
INVENTOR(S) : Christopher James Devine It is certified that error appears in the above-identified patent and that said Letters Patent is hereby corrected as shown below:

In the Claims

Column 8 Line 7, delete "claim 3" and insert --claim 2--.

Signed and Sealed this
Twenty-seventh Day of August, 2013

Teresa Stanek Rea
*Acting Director of the United States Patent and Trademark Office*